(12) United States Patent
Schaefer

(10) Patent No.: US 9,379,416 B2
(45) Date of Patent: Jun. 28, 2016

(54) METHOD FOR PERFORMING CELL BALANCING OF A BATTERY SYSTEM BASED ON CELL CAPACITY VALUES

(71) Applicant: GM GLOBAL TECHNOLOGY OPERATIONS LLC, Detroit, MI (US)

(72) Inventor: Sascha Schaefer, Selters (DE)

(73) Assignee: GM Global Technology Operations LLC, Detroit, MI (US)

(*) Notice: Subject to any disclaimer, the term of this patent is extended or adjusted under 35 U.S.C. 154(b) by 800 days.

(21) Appl. No.: 13/657,668

(22) Filed: Oct. 22, 2012

(65) Prior Publication Data

US 2014/0114594 A1 Apr. 24, 2014

(51) Int. Cl.
| | | |
|---|---|---|
| *H02J 7/00* | (2006.01) | |
| *G01R 31/36* | (2006.01) | |
| *G06F 19/00* | (2011.01) | |
| *H01M 10/42* | (2006.01) | |
| *H01M 10/44* | (2006.01) | |
| *B60L 11/18* | (2006.01) | |

(52) U.S. Cl.
CPC ....... *H01M 10/4207* (2013.01); *B60L 11/1866* (2013.01); *H01M 10/441* (2013.01); *H02J 7/0016* (2013.01); *B60L 11/1861* (2013.01); *B60L 11/1864* (2013.01); *B60L 2240/547* (2013.01); *B60L 2240/549* (2013.01); *G01R 31/362* (2013.01); *H01M 2010/4271* (2013.01); *Y02T 10/7005* (2013.01); *Y02T 10/7055* (2013.01); *Y02T 10/7061* (2013.01)

(58) Field of Classification Search
CPC ............ Y02T 10/7011; Y02T 10/7044; Y02T 10/7061; Y02T 10/7005; H02J 7/0016; B60L 11/1861; B60L 11/1866
USPC ........................................................ 702/63
See application file for complete search history.

(56) References Cited

U.S. PATENT DOCUMENTS

| | | | |
|---|---|---|---|
| 8,154,249 B2* | 4/2012 | Johnson | B25F 5/00 173/214 |
| 8,749,201 B2* | 6/2014 | Skelton | 320/116 |
| 2006/0033475 A1* | 2/2006 | Moore | 320/132 |
| 2011/0127960 A1* | 6/2011 | Plett | 320/116 |
| 2012/0194133 A1* | 8/2012 | Posamentier | H02J 7/0018 320/116 |
| 2013/0200852 A1* | 8/2013 | Song | H02J 7/0016 320/134 |

* cited by examiner

*Primary Examiner* — Mischita Henson
*Assistant Examiner* — Christine Liao
(74) *Attorney, Agent, or Firm* — John A. Milller; Miller IP Group, PLC

(57) ABSTRACT

A method for calculating the charge to balance for cells in a multi-cell battery. The method determines a depletion-goal state of charge (SOC) for the battery cells. The method determines a corresponding set of depletion-goal charges and usable charges for the set of cells, where the depletion-goal charge is calculated using the corresponding charge capacity and depletion-goal SOC and the usable charge is calculated using the corresponding actual charge and depletion-goal charge. The method determines a charge-bias using the set of usable charges. The method determines for the set of cells a corresponding set of charges to balance from the set of usable charges and the charge-bias.

14 Claims, 3 Drawing Sheets

METHOD FOR PERFORMING CELL BALANCING OF A BATTERY SYSTEM BASED ON CELL CAPACITY VALUES

BACKGROUND OF THE INVENTION

1. Field of the Invention

This Invention relates generally to a method for increasing the charge stored in a battery and, more particularly, to a system and method for determining the usable amount of charge to balance individual battery cells to optimize the usable charge of the battery.

2. Discussion of the Related Art

Electric-only and hybrid vehicles, such as battery electric vehicles, range extended electric vehicles, hybrid electric vehicles, plug-in hybrid electric vehicles and fuel cell hybrid electric vehicles, are becoming increasingly more prevalent. An electric-only vehicle will have the power supplied occasionally from an NC power grid that charges the battery, and the battery will discharge as the vehicle is driven. Hybrid electric vehicles generally combine a rechargeable battery system with power supplied by a power source, such as an internal combustion engine or a fuel cell system.

The battery system can be based on different chemistries including lithium-ion, nickel metal hydride, lead acid, etc. Depending on the battery characteristics, a control system should not allow a cell's charge to fall below a charge depletion floor or above an overcharging limit. The battery engineer takes performance, durability and safety into consideration when establishing the depletion floor and the overcharge limit. The depletion floor and overcharge limit are typically related to state of charge (SOC) and voltage.

Due to production variations, individual battery cell capacities, self-discharge resistance and other values vary resulting in the variation of the capacity of each battery cell to hold electric charge. In addition, how much of the cell's capacity is actually used also varies, because of the serial connection of the cells in the battery pack or module. For a serial configuration of cells, the electric current charges and discharges all of the cells simultaneously. This results in the cell with the least amount of charge determining the useable charge from the battery system, where usable charge remains locked-up in other cells of the battery system.

Some battery systems will attempt to get extra charge out of the other cells by redistributing the charge between cells based on cell voltage. An improvement over using voltage includes determining the actual electrical storage capacity and state of charge (SOC) of the cells in a multi-cell battery system.

A need exists for an algorithm that can accurately determine the charge to balance, that is extra charge that can be distributed (balanced) to the other cells so that the battery will supply the maximum usable charge and does not leave behind charge in cells when the first cell falls to the charge depletion floor.

SUMMARY OF THE INVENTION

In accordance with the teachings of the present invention, a method for determining the amount of charge necessary to balance cells in a multi-cell battery is disclosed. The method determines a depletion-goal state of charge (SOC) for the battery cells. The method determines a corresponding set of charge capacities and actual charges for a set of cells. The method determines a corresponding set of depletion-goal charges and usable charges for the set of cells, where the depletion-goal charge is calculated using the corresponding charge capacity and depletion-goal SOC and the usable charge is calculated using the corresponding actual charge and depletion-goal charge. The method determines a charge-bias using the set of usable charges. The method determines a corresponding set of charges to balance from the set of usable charges and the charge-bias for the set of cells.

Additional features of the present invention will become apparent from the following description and appended claims, taken in conjunction with the accompanying drawings.

DETAILED DESCRIPTION OF THE EMBODIMENTS

The following discussion of the embodiments of the invention is directed to a method for determining the amount of charge to balance individual cells of a battery is merely exemplary in nature, and is in no way intended to limit the invention or its applications or uses. For example, the invention has particular application to a multi-cell battery in an electric-only or hybrid-vehicle application. However, as will be appreciated by those skilled in the art, determining the amount of charge to balance individual battery cells will have other uses other then vehicle applications.

Figure 1:
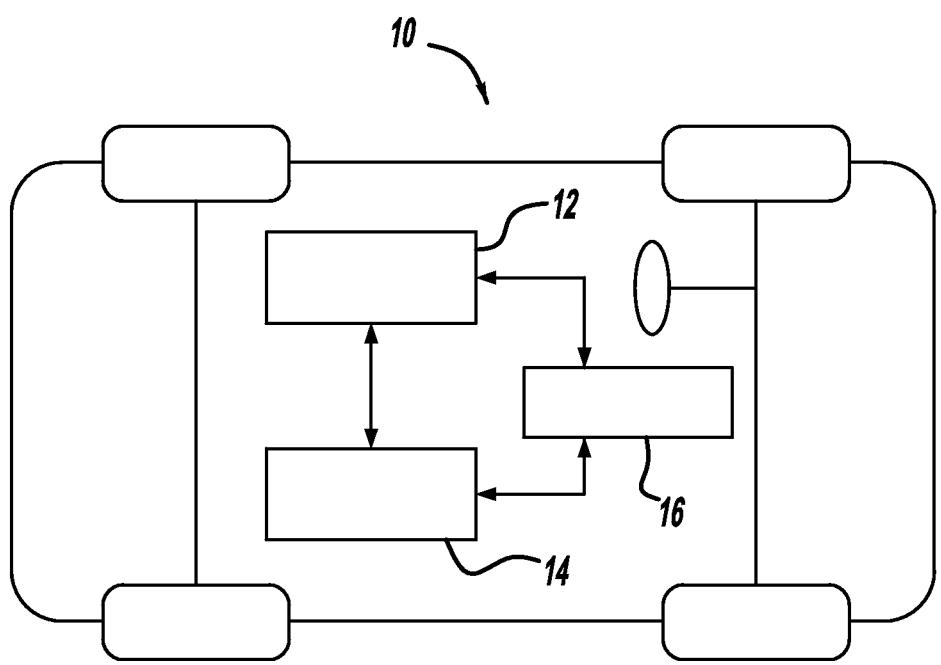
FIG. 1 is a simplified plan view of a hybrid vehicle including a battery and a main power source.

FIG. 1 is a simplified plan view of a hybrid vehicle 10 including a multi-cell battery 12 and a main power source 14. The vehicle 10 includes a controller 16 that is intended to represent all of the control modules and devices necessary for the proper operation and control of the power provided by the multi-cell battery 12 and the power source 14 to drive the vehicle 10, recharge the multi-cell battery 12 by the power source 14, and determine the SOC and charge capacity of the cells, as discussed below. The power source 14 can be a generator coupled to an internal combustion engine, a fuel cell or electricity from an NC power grid. In one embodiment, the controller 16 may include a vehicle integration control module having one or more subordinate control modules, such as, but not limited to, a multi-cell battery controller. One of ordinary skill in the art understands that the specific configuration of the vehicle 10 shown in FIG. 1 is for purposes of illustration only and is one of many configurations that may be used to implement the algorithm disclosed herein.

In one operation of the algorithm that can be implemented by the controller 16, the algorithm determines the cell's charge to balance, which is the extra charge in each cell above an optimal charge state for the set of battery cells, and the process starts with the algorithm determining the capacity of each cell to hold charge and the actual amount of charge currently in each cell. Using a pre-determined depletion-goal state of charge, SOC, the algorithm calculates for each cell the depletion-goal charge, which is the level at which the battery cell is considered fully drained. The algorithm determines the amount of usable charge per cell by taking the current actual charge content and subtracting the depletion-goal charge content. Finally, the algorithm determines the cell with the smallest usable charge and subtracts that from all of the other cell's usable charge to arrive at the cell's charge to balance. The charge to balance is the extra charge that would be left behind in the battery once the cell with the smallest usable charge reaches its depletion-goal charge.

Figure 2:
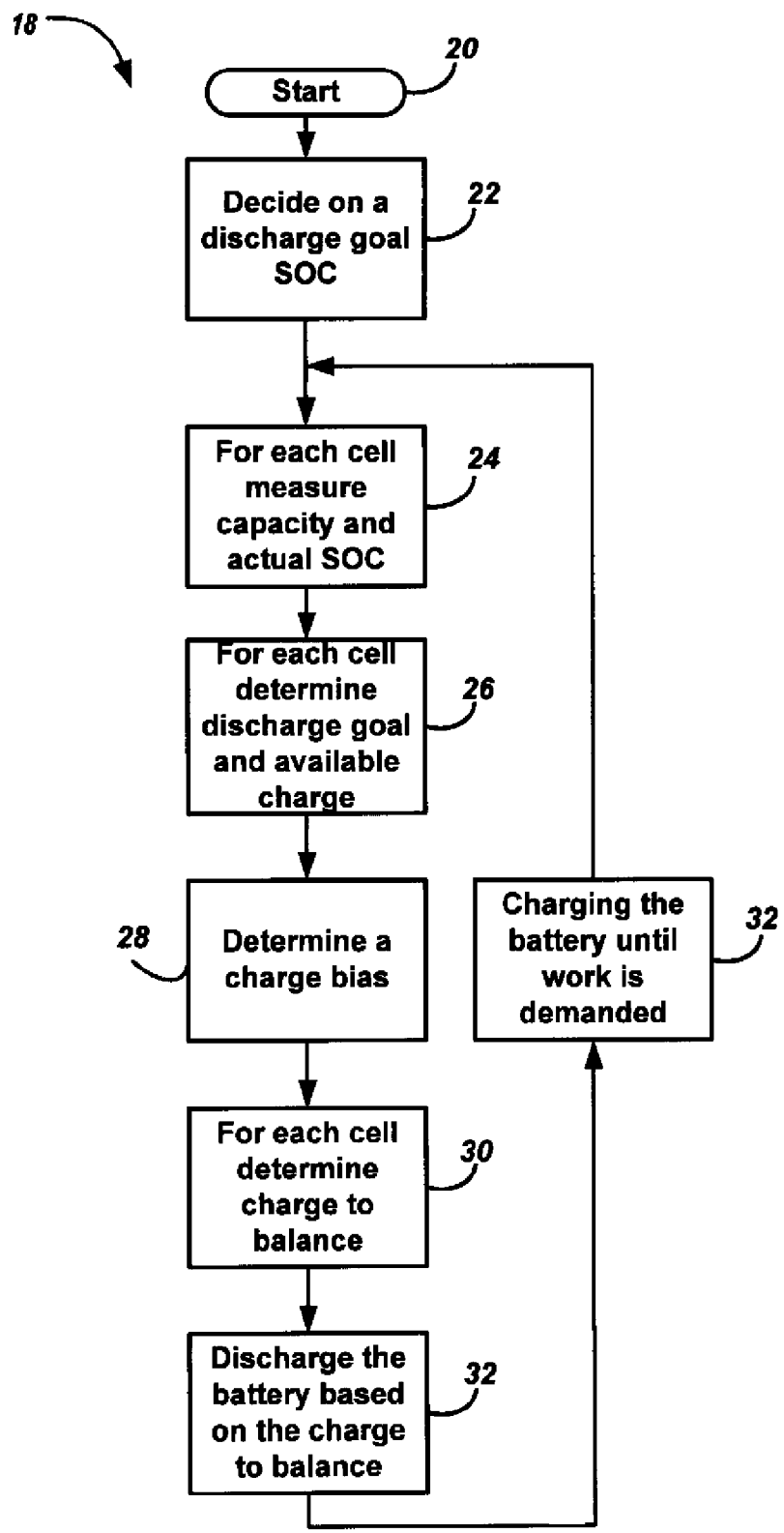
FIG. 2 is an exemplary flow chart of the charge balance algorithm.

FIG. 2 shows an exemplary flow chart 18 for the algorithm discussed above. The algorithm starts at box 20, and at box 22, a discharge-goal state of charge (SOC) is set based on the battery design. Next, at box 24, the algorithm obtains information of the capacity of each battery cell to hold charge and the current actual cell SOC. With all the capacities and actual SOCs the algorithm proceeds to box 26 where the discharge-goal charge and actual charge is calculated for each cell. The discharge-goal charge is determined using the SOC depletion-goal and the capacity of the cell. The usable charge, or charge available to do work, is determined using the actual charge and the discharge-goal charge. With the discharge-goal charges and usable charges, the algorithm, at box 28, determines a charge-bias that the algorithm uses, at box 30, to determine the how much extra charge each cell has that can be eliminated (the charge to balance) to put the battery in an optimal charge state. Then, at box 32, the battery supplies power including the use of balancing circuits. Each cell can have a balancing circuit that provides an extra electrical path that runs parallel to a battery cell. The balancing circuit has a defined resistance and this path can be switched on or off individually by the algorithm. The balancing algorithm uses the charge to balance to control the discharging of the cells to get the battery cells closer to an optimal charge state. When the demand for work from the battery is complete, the battery can be charged at box 34. The battery can continue charging at box 34 until there is a demand for the battery power or the battery reaches a charge termination state, at which point the algorithm again measures the capacity and actual SOC at the box 24 and continues as described above.

In detail, the algorithm first determines the actual charge content, e.g. after charging. The actual charge can be calculated using the following equation:

$$Q_{i,actual} = C_i \cdot SOC_{i,actual}, \quad (1)$$

where, $Q_{i,actual}$ is the actual charge content that individual cell i is currently holding, $C_i$ is the capacity of cell i to hold charge, and $SOC_{i,actual}$ is the state of charge, expressed as a %, of cell i.

The actual charge can be calculated by using measurements of the actual battery cells. For example, when the battery is at steady state, the voltage can be measured and used to determine the SOC, and the SOC along with the charge capacity can determine the actual charge. Another approach could be to have knowledge of the amount of charge at some point of the operation of the battery and measure the charge flowing in and out of the battery and its cells. From that information, the actual charge in the battery cells could be determined.

In order to get the most energy out of the battery system all the cells should finish discharging at the same point in time, so all cells reach the target depletion-goal charge together. If every cell reaches its depletion-goal charge simultaneously, then no charge would remain in any cell, and this would be an optimal discharge. Having the cells charged so that if discharging continues all cells would reach their depletion-goal charge together, would mean all of the cells charges are in an optimized balanced state.

The charge capacity can be determined in any of a number of suitable ways. An example of measuring charge capacity can be found in U.S. patent application Ser. No. 13/107,171, filed May 13, 2011, titled "Systems and Methods for determining cell Capacity Values in a Multi-cell Battery," assigned to the assignee of this application and herein incorporated by reference, which discloses a system and method to determine cell capacity of a vehicle battery pack.

The depletion-goal charge at the depletion-goal SOC is determined as follows:

$$Q_{i,goal} = C_i \cdot SOC_{goal}, \quad (2)$$

where, $Q_{i,goal}$ is the depletion-goal charge for an individual cell i, and $SOC_{goal}$ is the depletion-goal state of charge, expressed as a %, for all the cells in the battery system.

The $SOC_{goal}$ is the design objective for how much charge should remain in the cell when the cell is considered depleted, known as the SOC depletion-goal. The chemistry of the cell and other design factors determine the SOC depletion-goal, $SOC_{goal}$. The depletion-goal charge, $Q_{i,goal}$, is likely to be different for each cell because each cell can have a different charge capacity, $C_i$.

Finally, the algorithm determines the amount of charge to balance, that is, the amount of charge to remove from the cells for the battery to be in an optimized balanced state, where if discharging were to continue, then all cells would reach their depletion-goal charges, $Q_{i,goal}$ at the same time. The usable charge in a cell is the actual charge less the depletion goal charge. The amount of charge to balance can be calculated as follows:

$$Q_{i,CB} = Q_{i,actual} - Q_{i,goal} - Q_{Bias}, \quad (3)$$

where, $Q_{i,CB}$ is the charge to balance, or balancing charge, that is the amount of charge that needs to dissipate from cell i for the cell to be at an optimized charge state, and $Q_{Bias}$ is the amount of charge that can be used during operation before the cell with least useable charge reaches $Q_{i,goal}$.

The charge-bias can be determined using the following equation:

$$Q_{Bias} = \min(Q_{i,actual} - Q_{i,goal}), \quad (4)$$

where the charge-bias, $Q_{Bias}$, is the usable charge from the cell with the lowest useable charge.

Figure 3:
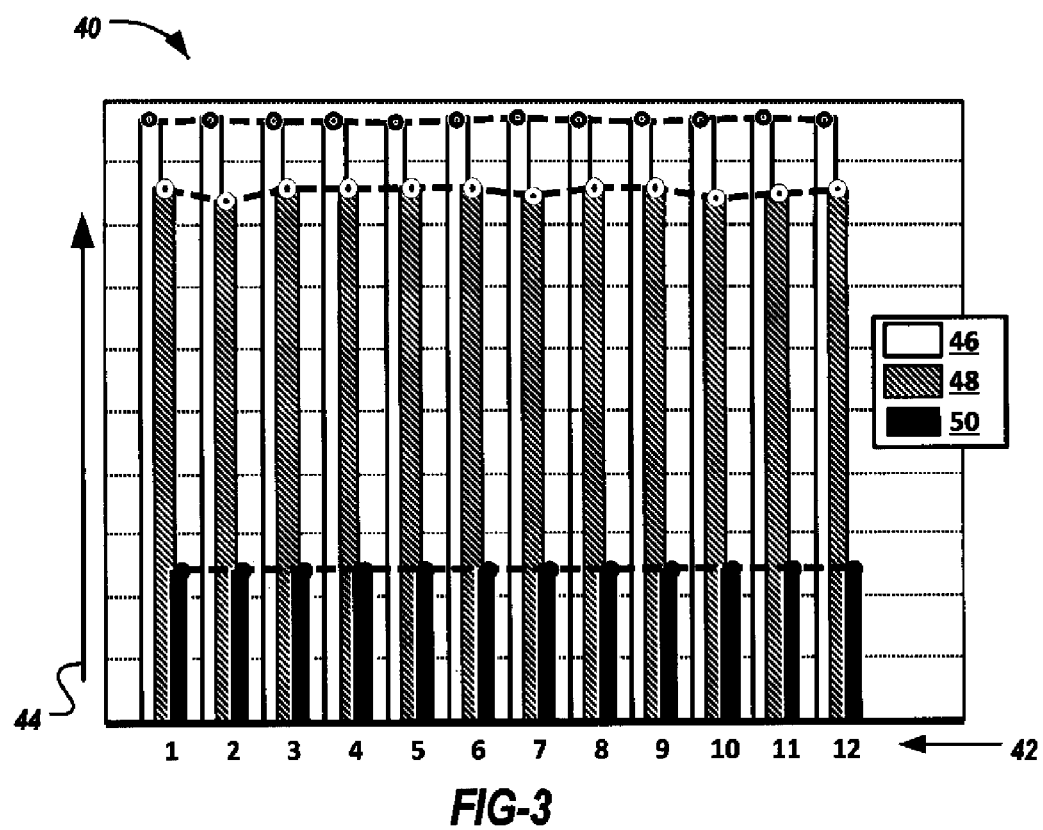
FIG. 3 is a graph showing the capacity, actual charge and the charge at the depletion-goal SOC for each cell of a multi-cell battery.
Figure 4:
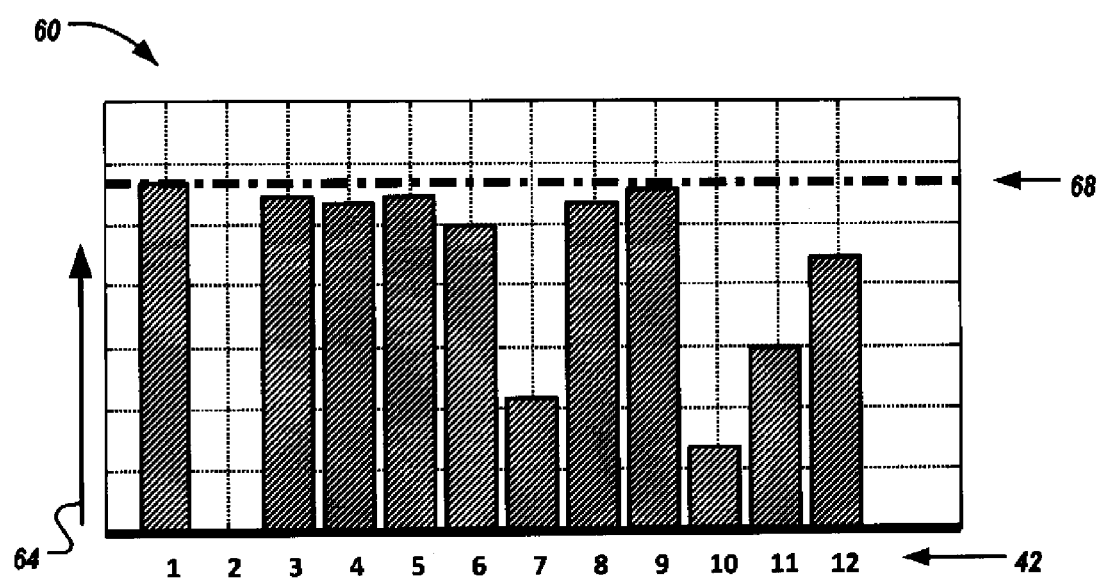
FIG. 4 is a graph showing the amount of charge to balance for the multi-cell battery of FIG. 3.

FIGS. 3 and 4 provide an example of applying the algorithm to a multi-cell battery with twelve cells.

FIG. 3 is a graph 40 showing charge capacity 46, actual charge 48 and depletion-goal charge 50 for each cell of a multi-cell battery. The charge capacity 46 indicates how much charge the cell is capable of holding. The actual charge 48 indicates how much actual charge the cell is currently holding. The depletion-goal charge 50 is the charge level at which the controller 16 would consider the cell depleted and should no longer provide power. In the graph 40, the horizontal axis 42 indicates the cell identifier, ranging from 1 to 12, and the vertical axis 44 represents the electric charge measured in ampere-hours, ranging from 0 to 50 ampere-hours.

FIG. 4 is a graph 60 showing for each of the cells 1-12 an amount of charge to balance. The horizontal axis 42 indicates the cell identifier, ranging from 1 to 12, and the vertical axis 64 represents the electric charge measured in ampere-hours, ranging from 0 to 1.4 ampere-hours. Cell #1 holds the maximum charge to balance of all the cells. In this case, cell #2 is the limiting cell that had the least amount of usable charge, so it provided the charge-bias used in Equation 4. The cell with the least amount of charge to balance is cell #2, having no charge to balance. The cell with the second lowest amount of charge to balance is cell #10.

With the charges to balance known, the battery control provided by the controller 16 can control the balancing circuits to optimize the charge of the cells in battery 12 to be in a more balanced state. The optimal condition of the battery 12 is to have the charge to balance be zero so that all the cells would reach the depletion-goal charge at the same time. With knowledge of the charge to balance, the battery 12 can redistribute the charge during rest or when the battery 12 provides power.

Modern battery control systems can control various aspects of the cells in a multi-cell battery. For example, often the controller 16 can activate an individual balancing circuit for each battery cell. Using this architecture and knowledge of the charge to balance the balancing circuits can be engaged based on the charge to balance. By knowing the balancing circuit's resistance and the cell voltage, and by controlling the amount of time the circuit is engaged based on the charge to balance, the balance of the charge amongst the cells can be controlled appropriately.

One approach to balancing the charge is executed during discharge or while the battery is at rest. The balancing circuits are engaged for the cells that have charge to balance. By switching the balancing circuits on, a current is flowing from the positive to the negative terminal of the cell. This current is established based on the measured cell voltage and the known balancing resistor. Integrating this current over time the charge to balance for a cell is reduced by a known amount. The balancing circuits stay engaged until the charge to balance diminishes to zero. In this example, cell #2 starts with a charge to balance of zero, thus the balancing circuit is turned off at all times. With this approach, on the next charging cycle the least charged cell would be able to have more charge, and then the overall charge useable from the battery would increase, assuming there is capacity in cell #2 to safely hold more charge.

Numerous balancing schemes are known by those of ordinary skill in the art that allow the charge to balance to be used to optimize battery performance.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

Give all terms used in the claims their broadest reasonable construction and their ordinary meaning as understood by those skilled in the art. Use of the singular articles such as "a", "the", "said", etc. should be read to recite one or more of the indicated elements.

What is claimed is:

1. A method for calculating a charge to balance for cells in a multi-cell battery comprising:
   determining a depletion-goal state of charge for the cells in the battery;
   receiving a corresponding set of charge capacities and a corresponding set of actual charges for a set of cells in the battery;
   determining a corresponding set of depletion-goal charges and a corresponding set of usable charges for the set of cells, where the depletion-goal charge is determined using the corresponding charge capacity, and the usable charge is determined using the corresponding actual charge and the corresponding depletion-goal charge;
   determining a charge-bias using the set of usable charges to determine how much extra charge is in each of the cells that is to be balanced;
   calculating a corresponding set of charges to balance from the set of usable charges and the charge-bias for the set of cells, where determining an amount of charge to balance includes using the equation:

$$Q_{i,CB} = Q_{i,actual} - Q_{i,goal} - Q_{Bias}$$

where $Q_{i,CB}$ is the charge to balance for cell i, $Q_{i,actual}$ is the actual charge content that individual cell i is currently holding, $Q_{i,goal}$ is the depletion-goal charge for an individual cell i, and $Q_{Bias}$ is the amount of charge that can be used during operation before the cell with least usable charge reaches depletion-goal charge; and
   controlling a plurality of balancing circuits using the calculated set of charges to balance to control discharging of the cells in the battery so that the cells get closer to a target depletion-goal charge at approximately the same time, wherein each of the cells in the battery is associated with one of the plurality of balancing circuits.

2. The method of claim 1 wherein receiving the corresponding set of actual charges includes using a measurement of the corresponding cells.

3. The method of claim 2 where the measurement is a measurement of voltage.

4. The method of claim 1 wherein receiving the corresponding set of actual charges includes using a measurement of charges flowing in and out of the corresponding cells.

5. The method of claim 1 wherein determining the charge-bias using the set of usable charges uses the lowest usable charge from the set of usable charges.

6. The method of claim 1 wherein receiving the actual charge includes using the equation:

$$Q_{i,actual} = C_i \cdot SOC_{i,actual},$$

where $Q_{i,actual}$ is the actual charge content that individual cell i is currently holding, $C_i$ is the capacity of cell i to hold charge, and $SOC_{i,actual}$ is the actual state of charge of cell i.

7. The method of claim 1 wherein determining the depletion goal charge includes using the equation:

$$Q_{i,goal} = C_i \cdot SOC_{goal},$$

where $Q_{i,goal}$ is the depletion-goal charge for an individual cell i, $C_i$ is the capacity of cell i to hold charge, and $SOC_{goal}$ is the state of charge depletion-goal for the cells in the battery.

8. The method of claim 1 wherein the set of cells in the battery includes all of the cells in the battery.

9. A method for calculating the charge to balance for a cell in a multi-cell battery comprising:
   determining a first charge capacity for a first cell in the battery;
   determining a second charge capacity for a second cell in the battery;
   determining a first state of charge (SOC) for the first cell; determining a second SOC for the second cell; calculating a first usable charge for the first cell using the first charge capacity and the first SOC;
   calculating, a second usable charge for the second cell using the second charge capacity and the second SOC;
   determining a charge-bias using the first usable charge and the second usable charge to determine how much charge is to be balanced between the first cell and the second cell;
   calculating a first charge to balance as a difference between the first usable charge and the charge-bias for the first cell; and using the first charge to balance for controlling a first balancing circuit for the first cell and a second balancing circuit for the second cell to control discharging of the first cell and the second cell so that the first cell and the second cell get closer to a target depletion-goal charge at approximately the same time.

10. The method of claim 9 wherein calculating the first usable charge and the second usable charge includes using a depletion-goal SOC.

11. The method of claim 1 wherein the usable charge is the corresponding actual charge less the corresponding depletion-goal charge.

12. The method of claim 9 wherein calculating the first usable charge includes subtracting a depletion-goal SOC from an actual charge of the first cell and calculating the second usable charge includes subtraction a depletion-goal SOC from an actual charge of the second cell.

13. The method according to claim 1 wherein each of the plurality of balancing circuits has a defined resistance, and each of the plurality of balancing circuits provides an extra electrical path that runs parallel to the corresponding battery cell of each of the plurality of balancing circuits.

14. The method according to claim 1 wherein calculating a corresponding set of charges to balance occurs every time the battery reaches a charge termination state.

* * * * *